(12) United States Patent
Yasufuku et al.

(10) Patent No.: US 6,370,025 B1
(45) Date of Patent: Apr. 9, 2002

(54) ELECTRONIC MODULE

(75) Inventors: Kaori Yasufuku; Taiji Hosaka, both of Yokohama; Masaaki Miyazawa, Kawasaki, all of (JP)

(73) Assignee: J.S.T. Mfg. Co., Ltd., Osaka (JP)

( * ) Notice: Subject to any disclaimer, the term of this patent is extended or adjusted under 35 U.S.C. 154(b) by 0 days.

(21) Appl. No.: 09/690,464

(22) Filed: Oct. 18, 2000

(30) Foreign Application Priority Data

Oct. 18, 1999 (JP) .......................................... 11-295226

(51) Int. Cl.[7] ................................................. H05K 7/20
(52) U.S. Cl. .................... 361/704; 361/703; 361/709; 361/710; 361/719; 361/720; 361/721; 174/16.1; 174/16.3; 165/80.3; 165/185
(58) Field of Search ................................ 361/686, 687, 361/690, 695, 704, 707, 709, 715–721, 729–730; 257/706, 718, 719, 722; 174/16.1, 16.3; 165/80.3, 104.33, 185

(56) References Cited

U.S. PATENT DOCUMENTS

| 5,597,034 A | * | 1/1997 | Barker, III et al. | ......... 165/80.3 |
| 5,608,610 A | * | 3/1997 | Brzezinski | .................. 361/704 |
| 5,722,839 A |   | 3/1998 | Yeh |                           |
| 5,894,408 A |   | 4/1999 | Stark et al. |                  |
| 5,901,038 A | * | 5/1999 | Cheng et al. | ................ 361/704 |
| 5,946,190 A | * | 8/1999 | Patel et al. | ................... 361/700 |
| 5,957,194 A | * | 9/1999 | Azar | ........................... 165/80.3 |
| 5,978,223 A | * | 11/1999 | Hamilton et al. | ............ 361/704 |
| 6,084,775 A | * | 7/2000 | Bartley et al. | .............. 361/705 |
| 6,160,707 A | * | 12/2000 | Yin | .............................. 361/704 |
| 6,195,266 B1 | * | 2/2001 | Padgett et al. | .............. 361/799 |
| 6,201,695 B1 | * | 3/2001 | Duesman et al. | ........... 361/703 |

FOREIGN PATENT DOCUMENTS

| EP | 0 456 038 A2 | 4/1991 |
| JP | 5-211076 | 8/1993 |
| JP | 7-122057 | 5/1995 |
| JP | 8-102346 | 4/1996 |
| JP | 8-250211 | 9/1996 |

\* cited by examiner

*Primary Examiner*—Leo P. Picard
*Assistant Examiner*—Boris L. Chervinsky
(74) *Attorney, Agent, or Firm*—Connolly Bove Lodge & Hutz LLP

(57) ABSTRACT

An electronic module of the invention is so structured that a plurality of first electronic components are mounted on a top surface of a card-like substrate; a first radiating board is commonly stuck to two or more top surfaces of the first electronic components; a plurality of second electronic components are mounted on a bottom surface of the substrate; and a second radiating board is commonly stuck to two or more bottom surfaces of the second electronic components. The heat generated by high-speed operation of the first and second electronic components is radiated to outside air through the first and second radiating boards.

12 Claims, 6 Drawing Sheets

ELECTRONIC MODULE

BACKGROUND OF THE INVENTION

1. Technical Field of the Invention

The present invention relates to an electronic module in which a plurality of electronic components are mounted on at least either of a top surface and a bottom surface of a card-like substrate and, more particularly, to an electronic module that can provide an efficient cooling of the electronic components.

2. Description of the Prior Art

In recent years, a mass storage device is being desired in computers such as notebook-sized personal computers. In terms of size limitation and expandability of the computer devices, a storage device in which electrical components, such as DRAM, are mounted directly on a mother board of a computer is on the decline. In place of this type of storage device, another type of storage device is now in the mainstream in which an electronic module, in which a plurality of electronic components such as DRAM are mounted on a multilayer printed board on which circuit wiring is formed, to have a predetermined memory capacity, is mounted on the mother board through a connector.

This only requires that only the connector for permitting the electrical connection of the electrical module is mounted onto the mother board of the computer devices by soldering or the like, thus enabling the large-capacity electronic components to be placed on the mother board by making the large-capacity electronic components compact by enhancing storage capacity of the electronic module. Also, the electronic module, which is easy for attachment to and detachment from the connector, can provide enhanced expandability.

However, with the speeding up of the electronic components such as direct DRAM mounted on the electronic module, a tendency develops to increase electric power consumption of the electronic components and thus increase heat generation values of the electronic components themselves. This causes possible fears of deterioration of the refresh characteristic and performance of the electronic module.

SUMMARY OF THE INVENTION

It is a primary object of the invention to provide an electronic module that can permit an efficient cooling of electronic components.

It is a secondary object of the invention to provide an electronic module that can permit an efficient cooling of electronic components mounted on the both sides of the top and bottom of the substrate.

It is a tertiary object of the invention to provide an electronic module connected with a connector that can permit an efficient cooling of electronic components mounted on both sides of the top and bottom of the substrate when the electronic module is fitted to a mother board through the connector to be in parallel thereto.

A first aspect of the invention to accomplish the primary object provides an electronic module comprising a card-like substrate, a plurality of electronic components mounted on at least one of a top surface and a bottom surface of the substrate to be arranged in parallel to the substrate, and a radiating board commonly mounted on two or more exposed surfaces of the electronic components.

This produces the result that the heat generated from two or more electronic components is transmitted to the radiating board commonly mounted on the flat exposed surfaces of the electronic components and radiated therefrom.

A second aspect of the invention to accomplish the secondary object provides an electronic module comprising a card-like substrate, a plurality of first electronic components mounted on a top surface of the substrate, a first radiating board commonly stuck on two or more top surfaces of the first electronic components, a plurality of second electronic components mounted on a bottom surface of the substrate, and a second radiating board commonly stuck on two or more bottom surfaces of the second electronic components.

This produces the result that the heat generated from the first and second electronic components mounted on the top and bottom surfaces of the substrate is transmitted to the first and second radiating boards mounted on the top and bottom surfaces of the substrate and is radiated therefrom.

To enhance the radiation of heat from the first and second radiating boards, each of the first radiating board and the second radiating board is preferably provided with a number of fins. Further, the fins are preferably formed by convex strips and concave strips arrayed alternately in a curved configuration.

A third aspect of the invention to accomplish the tertiary object provides an electronic module connected with a connector, wherein the electronic module comprises a card-like substrate, a plurality of first electronic components mounted on a top surface of the substrate, a first radiating board commonly stuck on two or more top surfaces of the first electronic components, a plurality of second electronic components mounted on a bottom surface of the substrate, and a second radiating board commonly stuck on two or more bottom surfaces of the second electronic components, and wherein the connector comprises a housing means to hold the electronic module to a mother board in substantially parallel to the mother board and a ventilation means, provided in the housing means, for permitting air to pass through along the electronic module.

This permits air to flow over the second radiating board mounted on the bottom of the substrate as well through the ventilation means provided in the housing means, thus producing the result that the first radiating board on the top side and the second radiating board on the bottom side can be cooled equally.

To enhance the radiation of heat from the first and second radiating boards, each of the first radiating board and the second radiating board is preferably provided with a number of fins which are formed by convex strips and concave strips arrayed alternately and extending along a long side direction or a short side direction of the substrate.

Other and further objects, features and advantages of the invention will appear more fully from the following description taken in connection with the accompanying drawings.

DESCRIPTION OF THE PREFERRED EMBODIMENT

Figure 1:
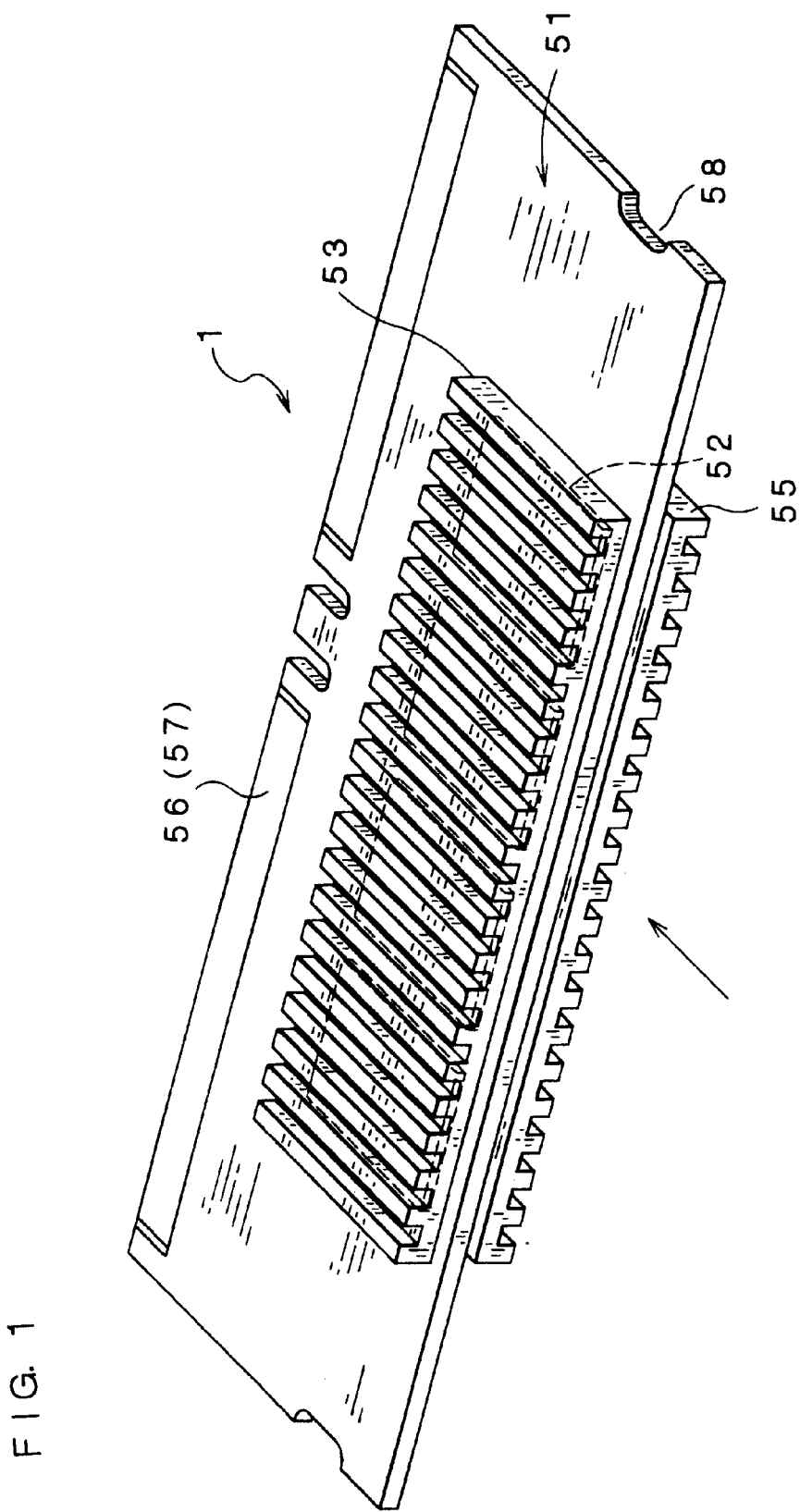
FIG. 1 is a perspective view of an electronic module fitted with radiating boards.
Figure 2:
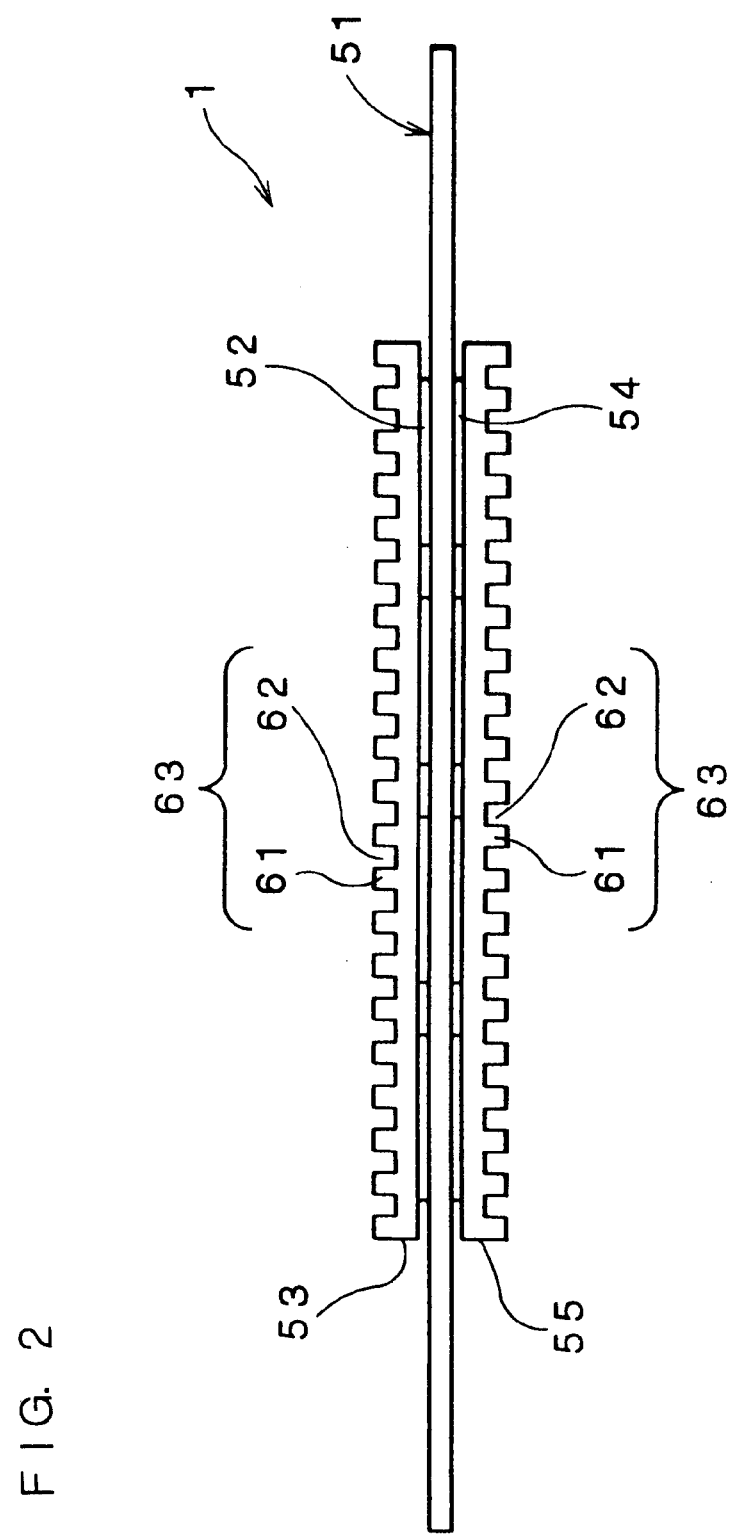
FIG. 2 is a side elevation view of the electronic module fitted with the radiating boards.

In the following, the preferred embodiments of the invention will be described with reference to the accompanying drawings. FIG. 1 is a perspective view of an electronic module 1 fitted with radiating boards 53, 55. FIG. 2 is a side elevation view of the same.

In FIGS. 1 and 2, the card-like module 1 comprises a substrate 51, a plurality of first electronic components 52 mounted on a top surface of the substrate 51, a first radiating board 53 stuck commonly to two or more top surfaces of the first electronic components 52, a plurality of second electronic components 54 mounted on a bottom surface of the substrate 51, a second radiating board 55 mounted on a bottom surface of the substrate 51, a second radiating board 55 stuck commonly to two or more bottom surfaces of the second electronic components 54 and conductive pads 56, 57 fitted to the top and bottom surfaces of the substrate 51 at front ends thereof, and locking recesses 58 provided at both lateral sides of the substrate 51.

The substrate 51 has a rectangular configuration having a short side dimension and a long side dimension. A variety of substrates including a resin substrate, a ceramic substrate, a glass-epoxy substrate, a flexible substrate and a metal substrate can be used as the substrate 51. A monolayer substrate and a multilayer substrate can both be used for the substrate 51. The use of the multilayer substrate, in particular, provides an increased degree of freedom in routing the wire between the electronic components 52, 54 and the conductive pads 56, 57.

The first and second electronic components 52, 54 mounted on the top and bottom surfaces of the substrate 51 include a memory chip such as DRAM for high-speed operation, an IC chip, a chip capacitor, a chip resistor and have flat exposed surfaces extending in parallel to the substrate 51. In the illustrated example, four flat memory chips are arranged at regular intervals in the long side direction to be in parallel to the substrate 51 and fixed to the top surface of the substrate 51 by appropriate adhesive or equivalent. The second electronic components 54 are also fixed to the bottom surface of the substrate 51 in the same manner as in the first electronic components 52.

The first radiating board 53 for the first electronic components 52 mounted on the top surface of the substrate 51 is made of a metal plate having good thermal conductivity and electroconductivity such as aluminum and is stuck to top flat exposed surfaces of the first electronic components 52 through an adhesive, an adhesive tape or a adhesive sheet. The first radiating board 53 has a size to be commonly mounted on two or more first electronic components 52 of high heat generation. In the illustrated example, the first radiating board 53 has an area to cover the entire exposed surfaces of four electronic components 52. A high thermal conductivity adhesive is selected among the adhesives used for adhesive bonding the first radiating board 53. The second radiating board 55 for the second electronic components 54 mounted on the bottom surface of the substrate 51 is also stuck to the second electronic components 54 on the bottom of the substrate 51 in the same manner as in the first radiating board 53. If the first electronic components 52 are different in height from each other or the second electronic components 54 are different in height from each other, the first radiating board 53 or the second radiating board 55 may be provided, at a part of its bottom, with a concave surface or a convex surface to ensure the adhesion between the both.

To allow air to flow in the short side direction of the electronic module 1, as shown in FIG. 3(a), fins 63, which comprise convex strips 61 and concave strips 62 arrayed alternately and extending in the short side direction of the electronic module 1, are provided on the first radiating board 53 and the second radiating board 55, respectively. To enhance the cooling efficiency of the air flowing in the widthwise direction of the electronic module 1, the convey stripe 161 and concave strips 162 of the fins 163 are preferably curved into valley configuration in view of a longitudinal line of the first radiating board 153 and the second radiating board 155, as shown in FIG. 3(b). Alternatively, the convex strips 261 and concave strips 262 of the fins 263 are preferably curved into hill configuration in view of a longitudinal line of the first radiating board 253 and the second radiating board 255, as shown in FIG. 3(c). It should be noted that the longitudinal line is not only the center line as illustrated but a line shifted from the center toward either short side.

To allow air to flow in the longitudinal direction of the electronic module 1, as shown in FIG. 4(a), fins 363, which comprise convex strips 361 and concave strips 362 arrayed alternately and extending in the long side direction of the electronic module 1, are provided on a first radiating board 353 and a second radiating board 355, respectively. To enhance the cooling efficiency of the air flowing in the long side direction of the electronic module 1, the convex strips 461 and concave strips 462 of the fins 463 are preferably curved into valley configuration in view of a short side line of the first radiating board 453 and the second radiating board 455, as shown in FIG. 4(b). Alternatively, the convex strips 561 and concave strips 562 of the fins 563 are preferably curved into hill configuration in view of a short side line of the first radiating board 553 and the second radiating board 555, as shown in FIG. 4(c). It should be noted that the short side line is not only the center line as illustrated but a line shifted from the center toward any either long side.

Operation of the electronic module 1 thus constructed will be described with reference to FIGS. 1 and 2. The first and second electronic components 52, 53 on the top side and bottom side of the electronic module 1 generate heat by the high-speed operation. The first and second radiating boards 53, 55 are stuck to the whole area of the exposed surfaces of the first and second electronic components 52, 53, so that the heat generated from the first and second electronic component 52,54, is transmitted to the first and second radiating boards 53, 55. As air flows in the direction indicated by an arrow in FIG. 1 with respect to the short side direction of the electronic module 1, it flows along the convex strips 61 and the concave strips 62 of the fins 63 of each of the first and second radiating boards 53, 55, so that interchange of heat is made in the fins 63 to radiate the heat generated from the first and second electronic components 52,54.

The first radiating board 53 and the second radiating board 55 are commonly fitted to two or more first electronic components 52 and two or more second electronic components 54, respectively, so that the heat-radiation efficiency is enhanced, as compared with the case where the radiating boards are each fitted to the individual electronic components. Even when the electronic components 52, 54 are fitted to the top and bottom of the substrate 51, since the radiating boards 53, 55 are provided for the top and bottom electronic components 52, 54, the radiation of heat from the electronic components 52, 54 is facilitated and thus thermal storage is prevented.

It should be noted that the present invention is applicable not only for the device wherein the electronic components are mounted on the top and bottom of the substrate 51 of the card-like electronic module 1 but also for the device wherein the electronic components are mounted on only one of the top and bottom of the substrate 51.

Figure 5:
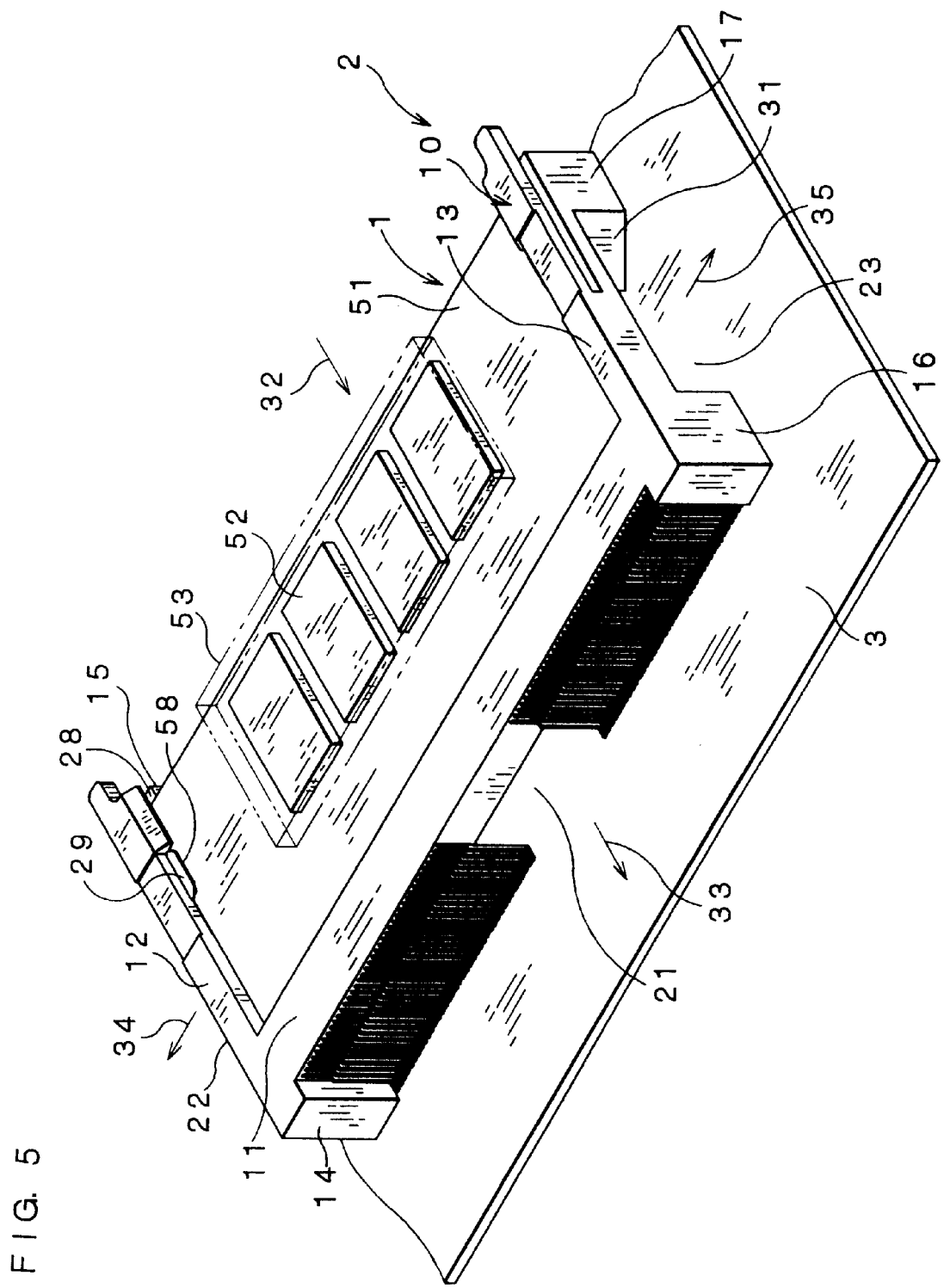
FIG. 5 is a perspective view of an electronic module connected with a connector.
Figure 6:
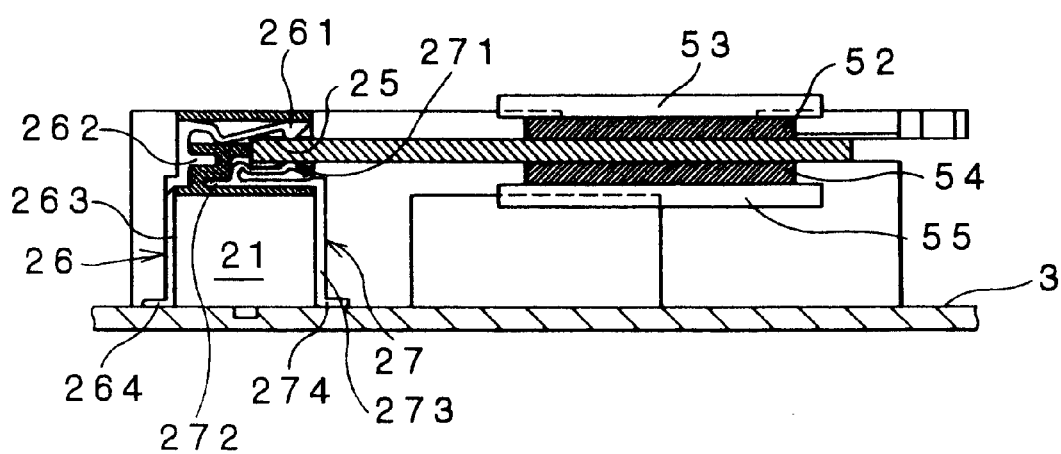
FIG. 6 is a sectional view of the electronic module connected with the connector.

Referring to FIG. 5, there is shown a perspective view of the electronic module connected with the connector. FIG. 6 is a sectional view of the same. With reference to FIGS. 5 and 6, a suitable connector 2 for the electronic module 1 in which the electronic components 52, 53 are mounted on the top and bottom of the substrate 51 will be described below.

The connector 2 shown in FIG. 5 comprises a housing (housing means) 10 having a main body 11 and a pair of arms 12, 13 integrally extending from both ends of the main body 11 in a perpendicular direction; base portions 14, 15 and 16, 17 of the pair of arms 12, 13 which are arranged in front and rear and integrally extend downward therefrom, a first ventilation hole (ventilation means) 21 provided between basse portions 14,16 under the main body 11; and a pair of second ventilation holes (ventilation means) 22, 23 which are provided between the base portions 14, 15 and under the arm 12 and between the base portions 16, 17 and under the arm 13, respectively.

As shown in FIG. 6, the main body 11 has a cavity 25, formed at about a perpendicular center portion thereof, for receiving therein the front end of the electronic module 1. The main body 11 has a structure wherein front contacts 26 having one end connectable with the upper conductive pad 56 of the electronic module 1 and the other end connectable with a mother board (not shown) can be press-inserted into the main body and also rear contacts 27 having one end connectable with the lower conductive pad 57 of the electronic module 1 and the other end connectable with the mother board (not shown) can be press-inserted into the main body.

The front contacts 26 are each stamped into a cantilever arm shape, having one end 261 biased inwardly of the cavity 25, a fitting portion 262 to be fitted into the main body 11, a vertically extending portion 263 extending downward across the first ventilation hole 21, and the other end 264 extending along a lower end of the base portion 14.

The rear contacts 27 are each stamped into a cantilever arm shape, having one end 271 biased inwardly of the cavity 25, a fitting portion 272 to be fitted into the main body 11, a vertically extending portion 273 extending downward across the first ventilation hole 21, and the other end 274 extending along the lower end of the base portion 14.

In FIG. 5, the right and left arms 12, 13 are symmetrical with respect to a center line of the main body 11. The arms 12, 13 have slots 28 for both ends of the electronic module 1 to be guided or supported in. The slots 28 have projections 29 formed on the way thereof to correspond to the recesses 58 formed in the both ends of the electronic module 1.

The first ventilation hole 21 is provided between the base portions 14, 16 and under the main body 11. Although the front and rear contacts 26, 27 extend downward from top to bottom across the ventilation hole 21, air flows through gaps between the adjacent front contacts 26 and gaps between the adjacent rear contacts 27.

The second ventilation holes 22, 23 are provided between the base portions 14, 15 and under the arm 12 and between the base portions 16, 17 and under the arm 13, respectively. Preferably, the ventilation holes 22, 23 each have such a slanted surface 31 as to increase in opening toward the outside, for ease of air suction. The first ventilation hole 21 and the second ventilation holes 22, 23 are not limited to the apertures opening to the bottom but may be formed into quadrangular apertures closing at the bottom.

The main body 11, the arms 12, 13 and the base portions 14, 15, 16, 17 are formed into one piece by use of insulating resin. The main body 11 and the arms 12, 13 may be formed separately so that they can be combined into one by fitting engagement. The base portions 14, 15, 16, 17 may also be combined with the arms 12, 13 by fitting engagement. Further, in place of the base portions 14, 15 provided at the both ends of each of the arms 12, 13, the base portions may alternatively be provided at both ends of the long side direction of main body 11.

The fitting of the connector 2 and the electronic module 1 thus structured will be described with reference to FIGS. 5 and 6. The both of the long side direction of the substrate 51 of the electronic module 1 are inserted in the slots 28. While the pair of the arms 12, 13 are pushed outward by the projections 29 in the slots 28, the electronic module 1 is inserted until the recesses 58 in the electronic module 1 are engaged with the projections 29. Then, the front end of the electronic module 1 is received in the cavity 25 and the conductive pads 56, 57 are brought into contact with one ends 261, 271 of the contacts 26, 27, to make electric connection between the electronic module 1 and the contacts 26, 27, as shown in FIG. 6. Thereafter, the electronic module 1 is held by the pair of arms 12, 13 at both ends thereof.

As shown in FIGS. 5 and 6, the electronic module 1 is mounted on the mother board 3 through the connector 2. Cooling airstream 32 is produced along the mother board 3. The airstream 32 entering from the side opposite the fitting side of the electronic module 1 is divided into three branches of an airstream 33 passing through the first ventilation hole 21 and airstreams 34, 35 passing through the second ventilation holes 22, 23. As a result of this, the airstream is produced on the bottom surface of the electronic module 1, so that the electronic components 54 mounted on the bottom surface of the electronic module 1 are efficiently cooled by the airstream through the radiating board 55. Also, the airstream 32 is also produced on the top surface of the electronic module 1, so that the electronic components 52 mounted on the top surface of the electronic module 1 are also cooled by the airstream through the radiation boad 53 simultaneously.

In the notebook-sized personal computer, the connector 2 is fixed on the mother board 3 with a little vertical space therebetween, and the electronic module 1 is fitted to that connector 2. The electronic module 1 is surrounded on three sides thereof by the housing 10 of the connector 2. Because of this, the electronic module 1 is prone to be stuffy at the bottom. However, since the ventilation holes 21, 22, 23 are provided in the housing 10 of the connector 2, the air is permitted to flow through the bottom of the electronic module 1 as well as through the top of the same. Since the radiating board 53, 55 is commonly mounted on the electronic components 52, 54 on the top and bottom of that electronic module 1, the electronic components 52, 54 are permitted to be cooled with efficiency.

Figure 3:
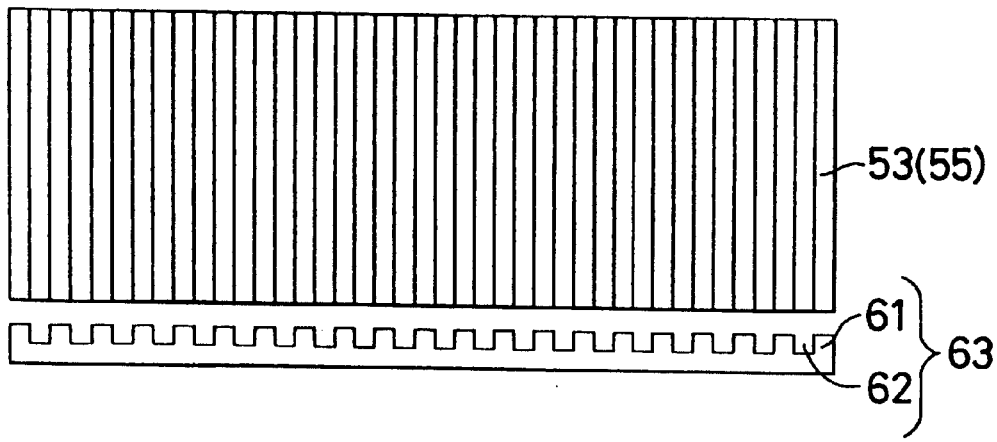
FIG. 3 are top views showing the configuration of fins arranged along a short side direction of the radiating board.
Figure 3:
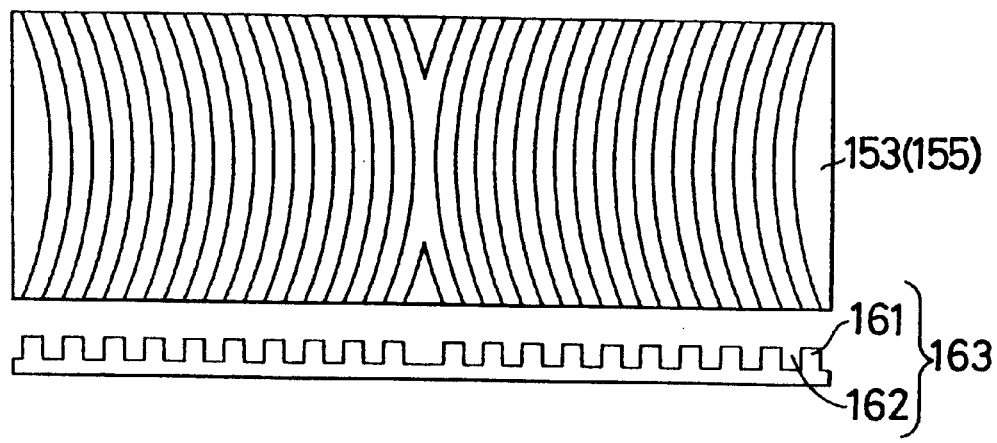
Figure 3:
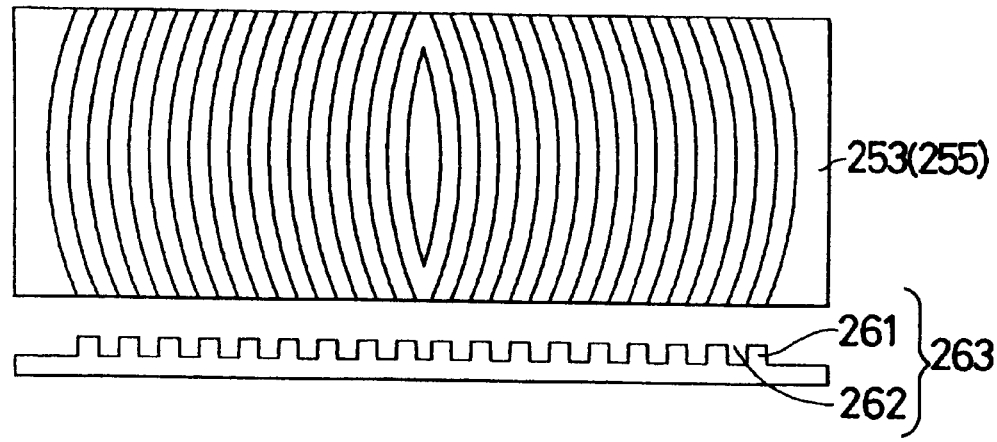

In a case where the ventilation holes 22, 23 provided under the arms 12, 13 of the connector 2 are closed, the airstream 32 will flow toward the ventilation hole 21. In this case, the fins 63, 163, 263 are oriented to extend along the widthwise direction of the electronic module 1, as shown in FIG. 3, so that the radiating board 53 (55), 153 (155), 253 (255) can operate efficiently.

Figure 4:
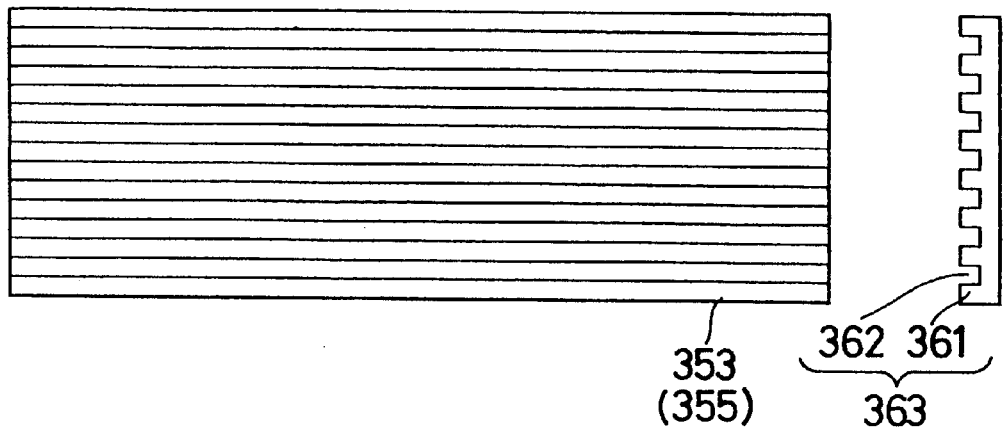
FIG. 4 are top views showing the configuration of fins arranged along a long side direction of the radiating board.
Figure 4:
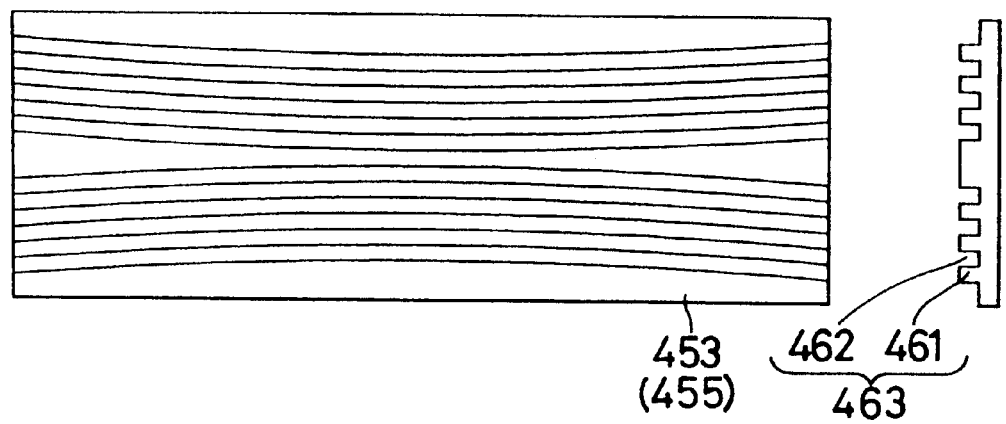
Figure 4:
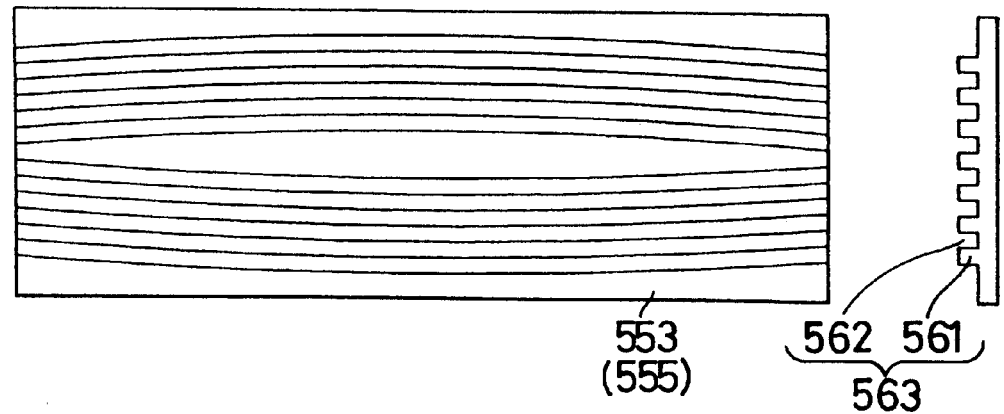

In another case where the ventilation hole 21 provided under the main body 11 of the connector 2 is closed, the airstream 32 will flow toward either of the ventilation holes 22, 23. In this case, the fin 363, 463, 563 are oriented to extend along the long side direction of the electronic module 1, as shown in FIG. 4, so that the radiating board 353 (355), 453 (455), 553 (555) can operate efficiently. In this case, modification may be made of the housing of the connector 2 by forming it from two separate components of a first member for supporting the front side of the electronic module 1 and a second member for supporting the rear side of the same.

What is claimed is:

1. An electronic module comprising a card-like substrate, a plurality of first electronic components mounted on a top surface of said substrate, a first plate-like radiating board commonly stuck on two or more top surfaces of said first electronic components, a plurality of second electronic components mounted on a bottom surface of said substrate, and a second plate-like radiating board commonly stuck on two or more bottom surfaces of said electronic components, and wherein each of said first radiating board and said second radiating board is provided with two sets of fins, each set of fins extending from said radiating boards in a lengthwise direction or a widthwise direction of said radiating boards, wherein one set of fins is curved outward and faces an edge of the board and the other set of fins is curved outward and faces the opposite edge of said board.

2. An electronic module according to claim 1, wherein said fins comprise a square-shaped cross section.

3. An electronic module according to claim 1, wherein said fins comprise a rectangular-shaped cross section.

4. An electronic module connected with a connector, wherein said electronic module comprises a card-like substrate, a plurality of first plate-like electronic components mounted on a top surface of said substrate, a first plate-like radiating board commonly stuck on two or more top surfaces of said first electronic components, a plurality of second electronic components mounted on a bottom surface of said substrate, and a second radiating board commonly stuck on two or more bottom surfaces of said second electronic components, wherein each of said first radiating board and said second radiating board is provided with two sets of fins, each set of fins extending from said radiating boards in a lengthwise direction or a widthwise direction of said substrate, wherein one set of fins is curved outward and faces an edge of the board and the other set of fins is curved outward and faces the opposite edge of said board, and wherein said connector comprises a housing means to hold said electronic module to a mother board in substantially parallel to said mother board and a ventilation means, provided in said housing means, for permitting air to pass through along a top surface and a bottom surface of said electronic module.

5. An electronic module connected to a connector according to claim 4, wherein said fins comprise a square-shaped cross section.

6. An electronic module connected to a connector according to claim 4, wherein said fins comprise a rectangular-shaped cross section.

7. An electronic module comprising a card-like substrate, a plurality of first electronic components mounted on a top surface of said substrate, a first plate-like radiating board commonly stuck on two or more top surfaces of said first electronic components, a plurality of second electronic components mounted on a bottom surface of said substrate, and a second plate-like radiating board commonly stuck on two or more bottom surfaces of said electronic components, and wherein each of said first radiating board and said second radiating board is provided with two sets of fins, each set of fins extending from said radiating boards in a lengthwise direction or a widthwise direction of said radiating boards, wherein each set of fins is curved to face the center of the board.

8. An electronic module according to claim 7, wherein said fins comprise a square-shaped cross section.

9. An electronic module according to claim 7, wherein said fins comprise a rectangular-shaped cross section.

10. An electronic module connected with a connector, wherein said electronic module comprises a card-like substrate, a plurality of first plate-like electronic components mounted on a top surface of said substrate, a first plate-like radiating board commonly stuck on two or more top surfaces of said first electronic components, a plurality of second electronic components mounted on a bottom surface of said substrate, and a second radiating board commonly stuck on two or more bottom surfaces of said second electronic components, wherein each of said first radiating board and said second radiating board is provided with two sets of fins, each set of fins extending from said radiating boards in a lengthwise direction or a widthwise direction of said substrate, wherein each set of fins is curved to face the center of said board, and wherein said connector comprises a housing means to hold said electronic module to a mother board in substantially parallel to said mother board and a ventilation means, provided in said housing means, for permitting air to pass through along a top surface and a bottom surface of said electronic module.

11. An electronic module connected to a connector according to claim 10, wherein said fins comprise a square-shaped cross section.

12. An electronic module connected to a connector according to claim 10, wherein said fins comprise a rectangular-shaped cross section.

* * * * *